United States Patent [19]

Nakagawa et al.

[11] Patent Number: 4,814,842

[45] Date of Patent: Mar. 21, 1989

[54] THIN FILM TRANSISTOR UTILIZING HYDROGENATED POLYCRYSTALLINE SILICON

[75] Inventors: Katsumi Nakagawa, Tokyo; Toshiyuki Komatsu, Yokohama; Yutaka Hirai; Satoshi Omata, both of Tokyo; Yoshiyuki Osada, Yokosuka; Takashi Nakagiri, Tokyo, all of Japan

[73] Assignee: Canon Kabushiki Kaisha, Tokyo, Japan

[21] Appl. No.: 201,259

[22] Filed: May 25, 1988

Related U.S. Application Data

[63] Continuation of Ser. No. 39,809, Apr. 15, 1987, abandoned, which is a continuation of Ser. No. 492,633, May 9, 1983, abandoned.

[30] Foreign Application Priority Data

May 13, 1982 [JP] Japan ................................. 57-81260

[51] Int. Cl.$^4$ ............................................. H01L 29/78
[52] U.S. Cl. ................................. 357/23.7; 357/23.9; 357/23.12; 357/4; 357/59
[58] Field of Search ................. 357/4, 23.1, 23.4, 23.7, 357/23.9, 23.12, 59, 59 R

[56] References Cited

U.S. PATENT DOCUMENTS

| | | | |
|---|---|---|---|
| 3,191,061 | 6/1965 | Weimer | 357/23.7 X |
| 3,290,569 | 12/1966 | Weimer | 357/23.7 X |
| 3,818,426 | 6/1974 | Bonnet et al. | 357/23.7 X |
| 4,081,817 | 3/1978 | Hara | 357/23.3 |
| 4,176,365 | 11/1979 | Kroger | 357/59 |
| 4,217,374 | 8/1980 | Ovshinsky et al. | 357/2 |
| 4,351,856 | 9/1982 | Matsui et al. | 357/59 |
| 4,409,605 | 10/1983 | Ovshinsky et al. | 357/2 |
| 4,409,607 | 10/1983 | Rumennik | 357/23.3 |

FOREIGN PATENT DOCUMENTS 3241959 5/1983 Fed. Rep. of Germany .
0061070 4/1984 Japan ................................. 357/23.3

OTHER PUBLICATIONS

Kamins et al., "Hydrogenation of Transistors Fabricated in Polycrystalline Silicon Films," *IEEE Electron Device Letters*, vol. EDL-1, No. 8, Aug. 80, p. 159.

Bower et al., "Mos Field Effect Transistors Formed by Gate Masked Ion Implantation," *IEEE Trans. on Electron Devices*, vol. ED-15, No. 10, Oct. 68, p. 757

Seager et al., "Passivation of Grain Boundaries in Polycrystalline Silicon," *Appl. Phys. Lett.* 34(5), Mar. 1, 1979, pp. 337-340.

Campbell, "Enhanced Conductivity in Plasma-Hydrogenated Polysilicon Films," *Appl. Phys. Lett.* 36(7), Apr. 1980, pp. 604-606.

Fang et al., "Making Ion Implanted Self-Aligned FET Using Silicide Metallurgy," *IBM Tech. Disc. Bull*, vol. 14, No. 12, May 72, p. 3687.

"MOS Moves Onto High-Speed Track," *U.S. Reports*, May 26, 1969, p. 49.

Abbas et al., "Formation of Sub-Micron Patterns with Negligible Tolerance," *IBM Technical Disclosure Bulletin*, vol. 26, No. 6, Nov. 1983, pp. 2732-2738.

Yoshida et al., "Short-Channel MOSFETS Fabricated (List continued on next page.)

*Primary Examiner*—Andrew J. James
*Assistant Examiner*—William A. Mintel
*Attorney, Agent, or Firm*—Fitzpatrick, Cella, Harper & Scinto

[57] ABSTRACT

A thin film transistor comprises a substrate, a semiconductor layer comprising a polycrystalline silicon containing 3 atomic % or less of hydrogen provided on said substrate, a source region and a drain region provided in the surface part of said semiconductor layer, an insulating layer provided on said semiconductor layer at the portion between these two regions, a gate electrode provided on said insulating layer, a source electrode forming an electrical contact with the source region and a drain electrode forming an electrical contact with the drain region, the overlapping portions between said gate electrode through the insulating layer beneath said gate electrode and the source region and between said gate electrode through the insulating layer beneath said gate electrode and the drain region begin 2000 Å or less in width.

6 Claims, 4 Drawing Sheets

OTHER PUBLICATIONS

Using CW N$_d$:YAG Laser Annealing of As-Implanted Source and Drain," *Japanese Journal of Applied Physics, vol. 20, No. 11, Nov. 1981, pp. 2121–2126.*

Vadasz et al., "Silicon–Gate Technology," *IEEE Spectrum,* Oct. 1969, pp. 28–35.

Shallcross, "Cadmium Selenide Thin–Film Transistors," *Proceedings of the IEEE,* vol. 51, No. 5, May 1963, p. 851.

Dennard et al., "Design of Ion-Implanted Mosfet's with Very Small Physical Dimensions," *IEEE Journal of Solid–State Circuits,* Oct. 1974, pp. 256–267.

Applied Physics Letters, vol. 36, 1980, pp. 604–606.

(a)

(b)

(c)

(d)

(e)

THIN FILM TRANSISTOR UTILIZING HYDROGENATED POLYCRYSTALLINE SILICON

This application is a continuation of application Ser. No. 039,809 filed Apr. 15, 1987, now abandoned, which was a continuation of abandoned Ser. No. 492,633, filed May 9, 1983.

BACKGROUND OF THE INVENTION

1. Field of the Invention

This invention relates to a field effect type thin film transistor film more particularly this invention relates to a polycrystalline silicon transistor a thin film, of which is constituted of a polycrystalline silicon thin film which is high in actuation characteristics, reliability and stability, said thin film transistor has a small interface level, small level difference at in its time of wiring in its, and also a small capacitance between gate and source or between gate and drain.

2. Description of the Prior Art

Recently, it has been proposed to use a silicon thin film formed on a certain substrate as the base material for a scanning circuit portion of an image reading device for use in image reading such as a one-dimensional photosensor made in a continuous length or a two-dimensional photosensor of an enlarged area, and as a driving circuit in an image display device utilizing a liquid crystal (abbreviated as LC), electrochromic material (abbreviated as EC) or electroluminescence material (abbreviated as EL). A polycrystalline rather than an amorphous silicon thin film is desired for realization of a large scale image reading device or image display device improved in higher speed and higher function. The effective carrier mobility $\mu$eff of a silicon thin film, for example, a field effect transistor, as base material for formation of a scanning circuit portion of a high speed, high function reading device or driving circuit portion of an image display device should be large, but that of the amorphous silicon thin film obtained by the ordinary discharge decomposition method is at most 0.1 $cm^2/V$. sec, which is far inferior as compared with the MOS type transistor prepared with a single crystalline silicon. Thus amorphous silicon does not satisfy the desired requirements. The small of mobility $\mu$eff, partly because the Hall mobility is small as an inherent characteristic of an amophous silicon thin film, means that the ease of preparation and the low productin cost of the amorphous silicon thin film cannot be taken advantage of. Also, amorphous silicon is inferior to single crystalline silicon in that it is essentially susceptible to changes with lapse of time.

In contrast, a polycrystalline thin film is greater in Hall mobility than an amorphous silicon thin film as apparently seen from the data actually measured, and also is far greater in the mobility $\mu$eff when made into a thin film transistor. Also it has theoretically a potential ability to give a thin film transistor having a mobility $\mu$eff value by far greater than that presently obtained. It is also expected to be stable with respect to change with lapse of time.

As methods for forming a polycrystalline silicon thin film on a given substrate over a large area, there have been known the CVD (Chemical Vapour Deposition) method, the LPCVD (Low Pressure Chemical Vapour Deposition) method, the MBE (Molecular Beam Epitaxy) method, the IP (Ion Plating) method, the GD (Glow Discharge) method and others. It is known that polycrystalline silicon thin films are formed on substrates with large areas according to any one of these methods, although the substrate temperatures may differ depending on the methods employed.

However, at present, a semiconductor element or a semiconductor device comprising a semiconductor layer of a polycrystalline silicon thin film formed by the methods of the prior art cannot exhibit sufficiently desired characteristics and reliability.

Thin film transistors are also known, which have a coplanar structure and a staggered structure. In such thin film transistors, the upper gate is positioned at the upper part of the semiconductor layer having good crystallinity.

However, in the staggered structure, during deposition of the semiconductor layer, there is an auto-doping effect from the lower source electrode and the lower drain electrode portions into the semiconductor layer. Thus the resistance of the semiconductor layer can not be sufficiently controlled. On the other hand, in the coplanar structure, during formation of the respective electrode portions of the upper source and drain, the interface between the semiconductor layer and the insulating layer is exposed to an etchant resulting in an increase of the interface level density, which will disadvantageously lead to lowering of effective mobility. Also, in the preparation of a thin film transistor of the prior art, the doped layer is fabricated by layer lamination, whereby the junction portions of source and drain exist at the same level as that of the semiconductor layer-insulating layer interface, thus creating a marked difference in the level in wiring the upper electrode to cause discontinuities of the electrode layer.

Further, the formation of an insulating layer at the portion different in level and the formation of a gate electrode thereon will make the overlapping portion greater, thus retarding disadvantageously the actuation speed of the transistor. Also, there is the drawback that leaks may occur between the gate and source or between the gate and drain at the portions different in level.

SUMMARY OF THE INVENTION

Extensive studies have been made in view of the above points based on the idea that the characteristics and reliability of the junction interface in most semiconductor elements having junctions (PN junction or MIS junction) in the laminate structure will determine the performance and reliability of such elements. Consequently there has been successfully obtained a thin film transistor excellent in characteristics, reliability, reproducibility and stability with lapse of time, etc.

That is, the present invention is based on the discovery that the element characteristics, $\mu$eff and stability of the characteristics with lapse of time can be improved to exhibit practically very excellent use characteristics and the scattering in characteristics of each element when designed as a device can be substantially cancelled to be greatly enhanced in practical application. These results are accomplished including hydrogen at a specified level in the silicon thin film formed in a polycrystalline silicon thin film semiconductor transistor, by making the surface of the region for source junction and drain junction positioned at the same level as the semiconductor-insulating layer interface, by providing the source junction and drain junction with certain depths, and by providiing a certain overlapping of the source and drain with the gate electrode.

A primary object of the present invention is to provide a thin film transistor having a polycrystalline silicon thin film semiconductor layer of high performance.

Another object of the present invention is to provide a thin film transistor by use of a polycrystalline silicon semiconductor formed on a substrate, which transistor is high in performance and reliability, and also high in stability.

A further object of the present invention is to provide a thin film transistor excellent in reproducibility and stability over time.

According to the present invention, there is provided a thin film transistor, comprising a substrate, a semiconductor layer comprising a polycrystalline silicon containing 3 atomic % or less of hydrogen provided on said substrate, a source region and a drain region provided on the surface part of said semiconductor layer, an insulating layer provided on said semiconductor layer at the portion between these two regions, a gate electrode provided on said insulating layer, a source electrode forming an electrical contact with the source region and a drain electrode forming an electrical contact with the drain region, the overlappiing portions between said gate electrode through the insulating layer beneath said gate electrode and the source region and between said gate electrode through the insulating layer beneath said gate electrode and the drain region being 200 Å or less in width.

DETAILED DESCRIPTION OF THE PREFERRED EMBODIMENTS

Figure 1:
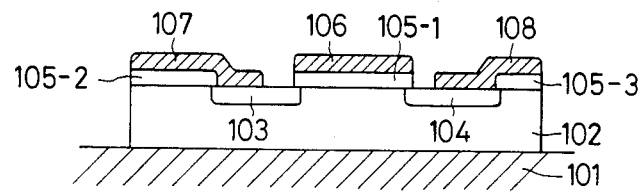
FIG. 1 is a schematic sectional view for illustration of the constitution of a thin film transistor (TFT) of the present invention.

FIG. 1 shows an example of typical basic structure of the thin film transistor of the present invention. In the surface part of a semiconductor layer 102 provided on an insulating substrate 101, there are provided a source layer (source region) 103 and a drain layer (drain region) 104; and on a portion of the semiconductor layer 102 between the source layer 103 and the drain layer 104, on a portion of the semiconductor layer 102 at the left side of the source layer 103, and on a portion of the semiconductor layer 102 at the right side of the drain layer 104, there are provided insulating layers 105-1, 105-2 and 105-3, respectively. Also provided are a gate electrode 106 on the insulating layer 105-1, a source electrode 107 with an electric contact with the source layer 103 and a drain electrode 108 with an electric contact with the drain layer 104, respectively.

In the TFT having the structure as shown in FIG. 1 in the present invention, the semiconductor layer 102 is constituted of a polycrystalline silicon thin film having the characteristics as described above, and the source layer 103 and the drain layer 104 between the semiconductor layer 102 and the two electrodes, namely the source electrode 107 and the drain electrode 108 are formed as doped layers in the semiconductor layer 102 by diffusion of an element belonging to the group III or the group V of the periodic table such as boron (B) or phosphorus (P) into the semiconductor layer 102 comprising the polycrystalline silicon, thereby forming a junction or an ohmic contact with each corresponding electrode.

The insulating layer 105 may be constituted of a material such as silicon nitride, $SiO_2$, $Al_2O_3$ and the like which can be formed according to the CVD (Chemical Vapour Deposition) method, LPCVD (Low Pressure Chemical Vapour Depositio) and method or PCVD (Plasma Chemical Vapour Deposition) method.

As the reactive gas to be employed for preparation of the polycrystalline silicon thin film constituting the semiconductor layer 102, there may be included substances comprising silicon as constituent atoms, as exemplified by monosilane ($SiH_4$), disilane ($Si_2H_6$), etc. which may also be diluted with gases such as $H_2$, Ar, He and the like, if necessary.

The field effect type TFT can be classified as the type in which a gate insulating layer is provided on a gate electrode (lower gate type) and the type in which a gate electrode is provided on a gate insulating layer (upper gate type). In addition, it may also be classified as the type in which source and drain electrodes are provided at the interface between the insulating layer and the semiconductor layer (Coplanar type) and the type in which source and drain electrodes are provided on the semiconductor plane confronting the interface between the insulating layer and the semiconductor layer (staggered type). Thus, there are four types of combinations in all, as is well known in the art. The structure as shown in FIG. 1 is an example of the present invention which is called an upper gate Coplanar type field effect TFT.

In the polycrystalline silicon thin film of the thin film transistor of the present invention, an amorphous or microcrystalline layer poor in crystalline orientation develops in the vicinity of the substrate surface, and growth of crystals occurs in the course of the growth of the film, thus being expanded in the shape of a fan, as frequently observed in a number of photographs of the film in the cross-section. For this reason, the upper gate type employing a film growth surface with greater grain sizes may be considered to be greater in mobility and more advantageous.

Accordingly, in the present invention, the semiconductor layer 102 and the insulating layer 105 are formed continuously as shown in FIG. 1 without breaking the vacuum in the device system for layer formation, and then portions of the semiconductor layer are doped with impurities for providing the source region and drain region, whereby the interface level density can be suppressed to lower the threshold voltage Vth.

The breakdowns between gate and source and between gate and drain can be suppressed to 0.1% or lower due to the small level difference.

Further, there is no disconnection at all at the source electrode portion or the drain electrode portion due to discontinuity of the electrode.

In the thin film transistor of the present invention, controlling of the hydrogen (H) content in the polycrystalline silicon thin film semiconductor layer can be realized according to various methods.

For example, it can be realized under specific conditions according to the method in which a hydrogenated silicon such as $SiH_4$, $Si_2H_6$ or the like is precipitated according to the glow discharge decomposition method (GD method); the method in which the sputtering with an Si target is effected in a gas containing $H_2$ (SP method); the method in which Si is vapor deposited by an electron beam in a $H_2$ plasma atmosphere (IP method); the method in which vapor deposition is effected in a $H_2$ atmosphere under ultra-high vacuum (HVD method); or further the method in which the polycrystalline silicon film formed by CVD or LPCVD is subjected to $H_2$ plasma treatment, etc. To be specifically noted in the present invention is that the thin film semiconductor layer of polycrystalline silicon formed by the GD method, the SP method and the IP method even at lower temperatures of 350° C. to 500° C., so long as it is formed so as to satisfy the restriction of H content as disclosed in this invention, can give transistor characteristics comparable to a polycrystalline silicon film known in the art as prepared by, for example, CVD or LPCVD at a high temperature (at 600° C. or higher) followed by $H_2$ plasma annealing. Moreover the thin film semiconductor layer can give stability and reliability, thus indicating directly the usefulness of the present invention.

The hydrogen atoms (H) contained in the polycrystalline silicon thin film exist primarily at the grain boundary of the polycrystalline silicon and they are bonded to Si atoms in the form of Si—H. Sometimes, however, they may be expected to be bonded in the form of $Si=H_2$ or $Si\equiv H_3$ or exist in the form of free hydrogen. Due to the hydrogen contained in such unstable states, changes in the characteristics over time may be expected to occur. From a number of experimental facts, it has been observed that at a level of 3 atomic % or less of H content, substantially no deterioration over time of transistor characteristics will occur, whereby the characteristics can be maintained stably. That is, it has been observed that in case the hydrogen atom content is more than 3 atomic %, the effective carrier mobility gradually decreases in the course of continuous actuation of the transistor, and the output drain current also decreases with lapse of time with a change in threshold voltage. In the present invention, the H content may preferably be 0.01 to 3 atomic %, more preferably 0.05 to 2 atomic %, most preferably 0.1 to 1 atomic %.

Measurement of the hydrogen (H) content in the polycrystalline silicon thin film defined in the present invention was conducted by means of a hydrogen analyzer conventionally used in chemical analysis (Elemental Analyzer Model-240, produced by Perkin Elmer Co.), when the content was 0.1 atomic % or more. In any case, 5 mg of a sample was charged into a holder for analyzer, the weight of hydrogen was weighed and the hydrogen content was calculated in terms of atomic %.

Microanalysis of a hydrogen content less than 0.1 atomic % was conducted by means of a secondary ion mass spectrometer-SIMS-(Model IMS-3f, produced by Cameca Co.). A conventional method was followed in this analytical method. That is, for prevention of charge-up, gold was vapor deposited to a thickness of 200 Å on a thin film of the sample, and measurement was conducted under the conditions of an ion energy of primary ion beam of 8 KeV and a sample current of $5 \times 10^{-10}$ A, with a spot size of 50 μm in diameter and an etching area of 250 μm × 250 μm, to determine the detection intensity ratio of $H^+$ ion relative to $Si^+$, from which the hydrogen content was calculated in terms of atomic %.

Next, the method for forming the semiconductor layer doped with impurities for the limited source and drain regions as mentioned above is to be described.

In the present invention, the substrate temperature during the layer forming process is desirably suppressed within 600° C. because a glass substrate is primarily used and the content of hydrogen contained in the layer is controlled to be suppressed to 3.0 atomic % or less.

For formation of a doped semiconductor layer, the gas phase diffusion method or solid phase diffusion method may be used. In each case, a plasma treatment may be carried out at the same time. As another method for forming a doped semiconductor layer, there may be mentioned a method comprising ionizing a doping source, accelerating and implanting the ions (ion implantation method). In the latter method, after implantation of the doping source, heat treatment, treatment in a plasma or heat treatment in a plasma may be carried out. As the doping source for gas phase diffusion or ion implantation, there may be employed gases such as of $B_2H_6$, $BCl_3$, $AsH_3$, $GeH_4$, $PH_3$, etc; the vapor of $BBr_3$; the vapor of $PCl_3$; and vapors of B, P, As, Ga, Sb, etc. As the solid doping source for solid phase diffusion, there may be inclined polycrystalline silicons, amorphous silicons, amorphous silicon nitrides (Si—N—H) and amorphous silicon oxides and the like which are doped with the group III or the group V elements such as P, B and others. It is also possible to employ a vapor deposited film of a metal such as Al, Au, In, etc.

In the present invention, as the result of investigations and experiments extensively made, at a substrate temperature during formation of the doped semiconductor layer ranging from 400° to 600° C., by suitable choice of the values of parameters such as power of plasma, gas pressure, acceleration voltage of ions, etc., the hydrogen content in the polycrystalline silicon semiconductor layer can be controlled to 3.0 atomic % or lower. The layer thickness of the doped portions of the semiconductor layer for the source region and the drain region can be suppressed to 200 to 2000 Å also the overlapping portions between the gate electrode and the source region and between the gate electrode and the drain region (in FIG. 1, portions in which the left end part of the gate electrode 106 overlaps with the right end part of the source layer 103 and the right end part of the gate electrode 106 overlaps with the left end part of the drain layer 104) can be sufficiently suppressed to 2000 Å or less in width, whereby the objects of the present invention can effectively be accomplished. The width of the respective overlapping portions is preferably 1500 Å or less, and more preferably 1200 Å or less.

In the thin film transistor of this invention, on account of the constitution as described above, each capacitance between the gate electrode and the source region and between the gate electrode and the drain region is made markedly smaller to afford rapid actuation speed and uniform characteristics as well as high stability and reliability.

For removal of the dope source after solid phase diffusion, it is desired to perform etching with the use of an etchant with an extremely great ratio of the etching speed of the doped semiconductor layer to that of the dope source. By doing so, it is possible to make the level of the surface of the doped surface equal to that of the interface between the insulating layer and the semiconductor layer.

For measurement of the depth of the doped semiconductor layer (layer thickness) of this invention, the doped semiconductor layer and the lower semiconductor layer were polished at the same time according to the slant polishing method, followed by stain etching, and its length was measured and calculated.

The change with lapse of time of the polycrystalline silicon thin film transistor for showing the effect of the present invention was performed according to the method as described below.

Figure 2:
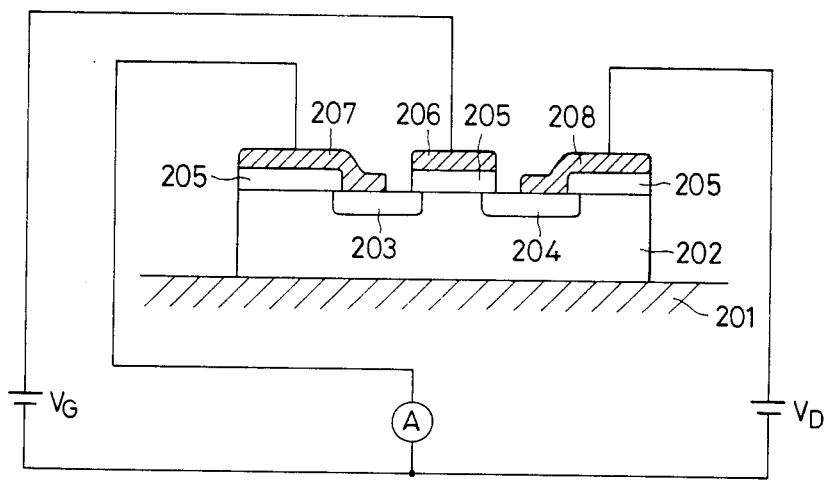
FIG. 2 is a schematic chart for illustration of the measurement of the TFT characteristics.

A TFT having a structure as shown in FIG. 2 was prepared, and by applying a gate voltage $V_G = 40$ V on the gate 206 and a drain voltage $V_D = 40$ V between the source 207 and the drain 208, the drain current $I_D$ passing between the source 207 and the drain 208 was monitored by an electrometer (Keithley 610 C electrometer) to measure the change of the drain current with lapse of time. The percentage of the change with lapse of time was determined by dividing the change of drain current after 500 hours continuous actuation by the initial drain current and multiplying the value obtained by 100 so as to be represented in %.

The threshold voltage Vth of TFT was defined, as conventionally conducted in MOS FET (Metal oxide semiconductor field effect transistor), as the point at which the line extrapolated from the straight line portion in $V_D - \sqrt{I_D}$ curve crosses over the abscissa of $V_D$. The changes of Vth before and after the change with lapse of time were examined at the same time and the changed quantity was represented in volt.

As disclosed in the present invention, particularly in formation of the semiconductor layer and the doped layer according to glow discharge decomposition of a gas of a hydrogenated silicon compound (GD method), sputtering of silicon in H₂ atmosphere, ion plating (IP method) or ultra-high vacuum vapor deposition (HVD method), it is possible to form a polycrystalline silicon thin film suited for the object of this invention at a substrate surface temperature of 600° C. or lower (the range from about 350° to 600° C). This fact is not only advantageous in uniform heating of a substrate or provision of a cheap substrate material of large area in preparation of a driving circuit or a scanning circuit with a large area for a large area device, but is also important in that a light-transmissive glass plate can be used as a substrate for transmissive-type display device or in an image device such as a photoelectric converting light-receiving element of the type in which light enters on the substrate side.

Accordingly, since the present invention can be practiced at lower temperature zones as compared with the prior art techniques, usual low melting glasses, heat-resistant plastics, etc. may be employed in addition to heat-resistant glasses such as high melting glasses, hard glass, etc., heat-resistant ceramics, sapphire, spinel, silicon wafer, etc. conventionally used in the prior art.

As the glass substrate, there may be employed a regular glass having a softening point of 630° C., an ordinary hard glass having a softening point of 780° C., a ultra-hard glass having a softening point of 820° C. (JIS First grade ultra-hard glass), etc.

In the preparation method of this invention, an advantage is that films can be formed without impairing the substrate, because any substrate can be used with a substrate temperature which can be suppressed lower than the softening point of the substrate employed.

In Examples of the present invention, there was primarily employed as the substrate glass Corning #7059 glass among the regular glasses (soda glasses) having relatively low softening points, but it is of course possible to use a quartz glass having a softening point of 1,500° C. as the substrate. However, from a practical standpoint, the use of regular glasses is advantageous in preparation of thin film transistors at low cost and over large areas.

A field effect type thin film transistor (FE-TET) using the polycrystalline silicon thin film containing H (hydrogen) as specified above and having such as structure as mentioned above is improved in transistor characteristics (effective carrier mobility, threshold voltage, ON/OFF ratio, gm, etc.), without changes in transistor characteristics with lapse of time during continuous actuation, also rapid in actuation speed due to small overlapping between the gate electrode and the source or drain region, and the yield and scattering of the elements can be markedly improved, whereby it is possible to provide stably scanning circuits or driving circuits for display or image devices utilizing LC, EL or EC.

In order to further illustrate the present invention, preparation of polycrystalline silicon thin films, preparation of TFT and the results of TFT behaviors are described in detail by way of the following Examples.

EXAMPLE 1

Figure 3:
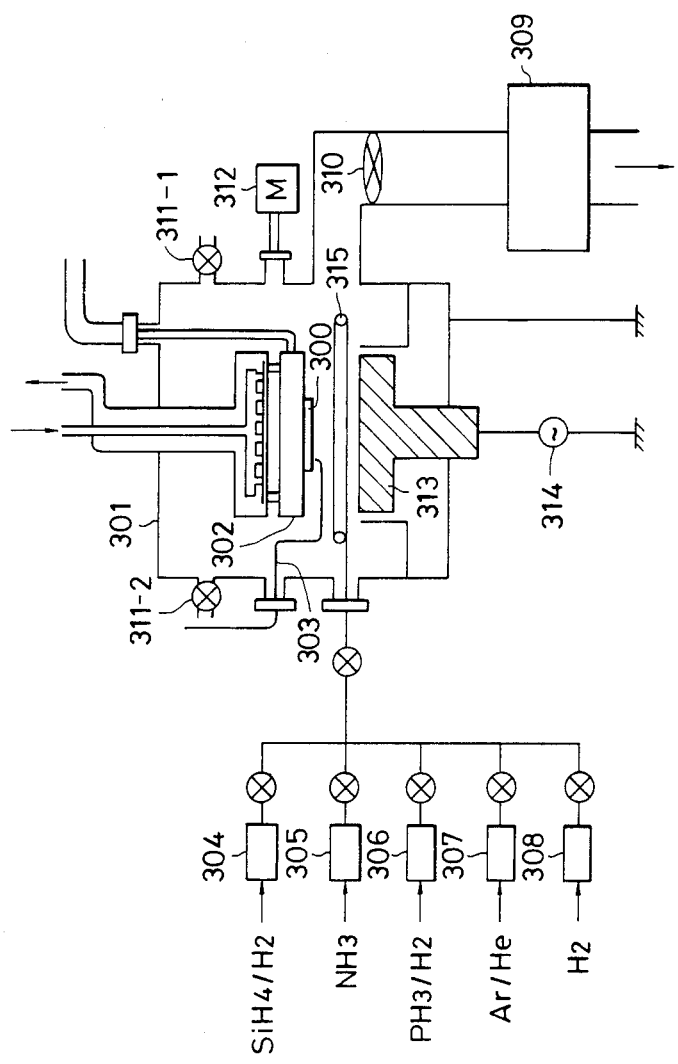
FIG. 3 is a schematic flow sheet for illustrating of the device used for preparation of the TFT of the present invention.

This example described formation of a polycrystalline silicon thin film on a substrate according to the glow discharge decomposition method and preparation of a TFT by use thereof. Formation of the polycrystalline silicon thin film was carried out by means of the device as shown in FIG. 3. As the substrate 300, Corning glass #7059 (0.5 mm in thickness) was used.

First, after the substrate 300 was washed, it was lightly etched on its surface with a mixture of ($HF + HNO_3 + CH_3COOH$) and, after drying, mounted on a substrate heating holder 302 placed on the anode side in a bell-jar vacuum deposition chamber 301.

Then, the bell-jar 301 was evacuated by a diffusion pump 309 to a background vacuum degree of $2 \times 10^{-6}$ Torr. This operation was done carefully because, if the vacuum is poor, a reactive gas does not effectively take part in film deposition, and moreover entrainment of oxygen atoms (O), nitrogen atoms (N) may also occur in the film to thereby change markedly the resistance of the film. Next, the substrate temperature Ts was raised and the substrate 300 was maintained at 500° C. (the substrate temperature was monitored by a thermocouple 303). Then, H₂ gas was introduced into the bell-jar 301 while being controlled by the mass-flow controller 308 to clean the surface of the substrate 300, followed by introduction of the reactive gases. The substrate temperature Ts was set at 350° C. The pressure in the bell-jar during discharging was maintained at 0.2 Torr.

In this Example, as the reactive gases to be introduced, a gas mixture of SiH₄ gas diluted with easily handled H₂ gas to 3 vol.% (abbreviated as SiH₄(3)/H₂), that is, SiH₄ diluted to vol.% with H₂, was employed. The gas flow rate was controlled to 5 SCCM through a mass flow controller 304. The pressure in the bell-jar 301 was set at the predetermined value, for example 0.2 Torr by means of an absolute pressure gauge 312 by controlling the pressure control valve 310 on the evacuation side of the bell-jar 301. After the pressure in the bell-jar 301 was stabilized, a high frequency electric field of 13.56 MHz was applied from a power source 314 on the cathode electrode 313 to commence glow discharging. The voltage was 0.7 KV, with the current being 60 mA and RF discharging power 20 W. Under these conditions, discharging was continued for 60 minutes to complete formation of the polycrystalline silicon film, followed by intermission of discharging and also intermission of inflow of the starting gas. Then, the substrate temperature was lowered to 180° C. and maintained thereat so as to be ready for the next process.

The film deposition speed of silicon under these conditions was 0.2 Å/sec. The film formed had a thickness of 3600 Å and its uniformity was within ±10% relative to the substrate dimension of 120×120 mm when employing a circular ring blowing outlet.

The polycrystalline silicon film was n-type with a resistance value of ca. $10^7$ Ω. cm. As the next step, following the process as shown in FIGS. 4(a) to 4(e), a TFT was prepared using this film.

Subsequent to the deposition of the polycrystalline silicon film as described above and shown in FIG. 4(a), the insulating layer 105 was formed on the polycrystalline silicon film 102 on the substrate 101 in the following manner.

Figure 4:
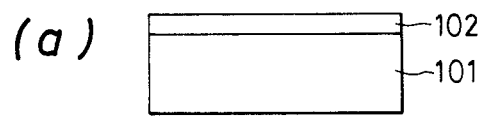
FIGS. 4(a) to 4(e) are schematic sectional views for illustration of the steps for preparation of the TFT of the present invention.
Figure 4:
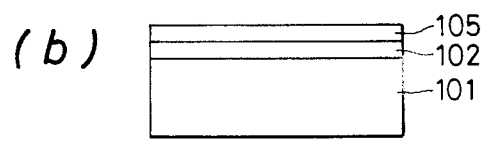
Figure 4:
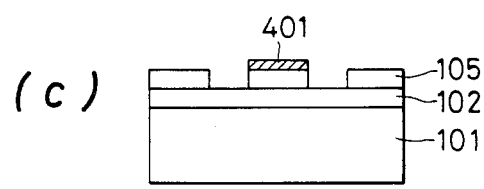
Figure 4:
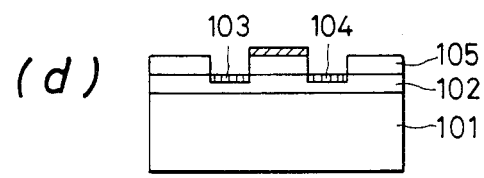
Figure 4:
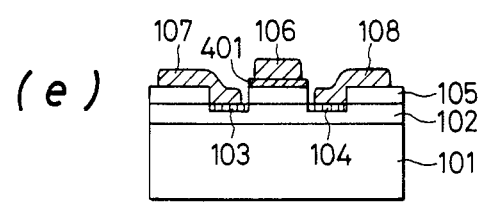

The bell-jar was evacuated similarly as in the preparation of the polycrystalline silicon, with the substrate temperature Ts being adjusted to 450° C., $NH_3$ gas at 20 SCCM and $SiH_4$ gas diluted to 10 vol.% with $H_2$ (abbreviated as $SiH_4$ (10 )/$H_2$) at 5 SCCM were introduced into the bell-jar, wherein glow discharging was excited to deposit an insulating layer (SiNH film) 105 to a thickness of 2500 Å. [Step (b) of FIG. 4(b).]

Next, a heat-resistant metal film 401 such as Mo film, etc. was formed on the insulating layer 105 by vapor deposition. Then, holes for formation of the source region and the drain region were opened in the insulating layer 105 by photoetching.

During this operation, the heat-resistant metal film 401 was left behind at the gate electrode portion by usual photoetching. [Step (c) of FIG. 4(c).]

Subsequently, the substrate having the layers thereon as shown in FIG. 4(c) was set again in the aforesaid bell-jar 301, and the substrate temperature Ts was maintained at 500° C.

Then, $PH_3$ gas diluted to 4000 vol ppm with hydrogen gas [abbreviated as $PH_3(4000)/H_2$] was permitted to flow into the bell-jar 301 and the pressure in the bell-jar was adjusted to 0.2 Torr, whereupon glow discharging was effected at 13.56 MHz, a power of 400 W for 50 minutes to form a n+ semiconductor layer doped with P (to be made into the source region 103 and the drain region 104). [Step (d) of FIG. 4(d).]

The n+ semiconductor layer had a layer thickness of 1500 Å and a surface sheet resistivity of 0.1 Ω per square.

Subsequently, Al for formation of electrodes was vapor deposited, followed by etching to a desired pattern to form the source electrode, the drain electrode and the gate electrode, respectively. [Step (e) of FIG. 4(e).]

The thus prepared TFT had a channel length of 20μ, a channel width of 650μ and a channel overlapping of 1400 Å.

Figure 5:
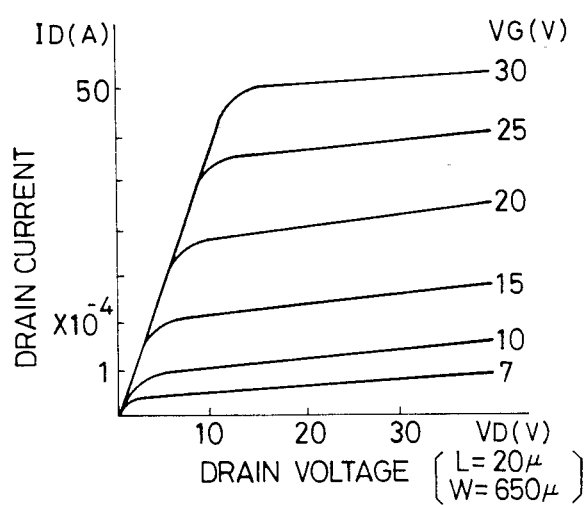
FIG. 5 is a $V_D$-$I_D$ graph showing the characteristics of the TFT of the present invention.

FIG. 5 shows exemplary characteristics of the thus prepared TFT. In FIG. 5, there is shown the exemplary characteristic of TFT showing the relation between the drain current $I_D$ and the drain voltage $V_D$ with the gate voltage $V_G$ as the parameter. The threshold voltage of the gate is as low as 3 V, and the ratio of the current value at $V_G=20$ V relative to that at $V_G=0$ being made a number of three figures or more.

In the manner as described above, five samples of Sample No. 101 to 105 were prepared and TFT characteristics were measured to obtain the results as shown in Table 1.

TABLE 1

| Sample No. | 101 | 102 | 103 | 104 | 105 |
|---|---|---|---|---|---|
| Layer thickness of doped layer (Å) | 100 | 300 | 1100 | 1500 | 3200 |
| H content (atomic %) | 0.03 | 0.1 | 0.5 | 1.9 | 4.0 |
| Effective mobility of TFT (cm²/V · sec) | 0.08 | 1.2 | 4.5 | 5.6 | 5.8 |
| Vth (V) | 8.0 | 4.0 | 3.2 | 3.0 | 3.1 |
| Change with lapse of time (%) | 0.5 | 0 | 0 | 0 | 5.1 |
| Overlapping width of gate electrode (Å) | 100 | 280 | 1000 | 1400 | 3000 |

From the results shown in the above Table 1, when the hydrogen (H) content is 3 atomic % or less and the doped semiconductor layer has a layer thickness of 2000 Å or less, TFT characteristics are found to be excellent with no change with lapse of time and a rapid switching speed.

EXAMPLE 2

After deposition of a polycrystalline silicon film according to the same porcedure as in Example 1 under the conditions of the substrate temperature for glow discharge decomposition of 500° C., RF discharging power of 50 W (electrode: 20 cm φ), the flow rate of the silane gas ($SiH_4(3)/H_2$) of 10 SCCM and the pressure of 0.05 Torr, and thereafter an insulating layer with a thickness of 3500 Å was deposited continuously thereon under the same conditions as in Example 1.

Then, according to the photoetching step, holes for formation of the source region and the drain region were opened on the insulating layer, and after the substrate was reset in the aforesaid bell-jar, the substrate temperature was maintained at 550° C.

Then, $B_2H_6$ gas diluted to 5000 vol. ppm with hydrogen gas (hereinafter abbreviated as $B_2H_6(5000)/H_2$) was permitted to flow into the bell-jar 301 to adjust the pressure in the bell-jar to 0.2 Torr, whereupon glow discharging was effective to obtain a P-type semiconductor layer (doped layer) doped with B.

The doped layer had a layer thickness of 1500 Å and a surface sheet resistivity of 0.1 Ω per square.

Next, following the same procedure as in Example 1, the respective source, drain and gate electrodes were formed to prepare a TFT. In such a procedure, 5 samples of Sample No. 201 to 205 were obtained.

The results of measurements of TFT characteristics of respective samples are shown in Table 2.

TABLE 2

| Sample No. | 201 | 202 | 203 | 204 | 205 |
|---|---|---|---|---|---|
| Layer thickness of doped layer (Å) | 120 | 280 | 1000 | 1500 | 3000 |
| H content (atomic %) | 0.02 | 0.2 | 0.4 | 1.8 | 3.2 |
| Effective mobility of TFT (cm²/V · sec) | 0.05 | 0.8 | 3.0 | 4.5 | 4.3 |
| Vth (V) | 10.2 | 6.8 | 5.0 | 5.3 | 5.0 |
| Change with lapse of time (%) | 0.8 | 0.1 | 0 | 0 | 3.0 |
| Overlapping width of gate electrode (Å) | 100 | 250 | 950 | 1500 | 3000 |

EXAMPLE 3

At the window portions for source, drain doping on a polycrystalline silicon layer (layer thickness: 5000 Å) on a glass substrate formed according to the same procedure as in Example 1, boron B+ was injected by the ion implantation method at a substrate temperature of 500° C. at an acceleration voltage of 50 KeV in a doping amount of $10^{15}$ atoms/cm$^3$.

Then, a sample was set in the substrate holder in the bell-jar 301 as shown in FIG. 3, and heat treatment was applied at a substrate temperature of 500° C. and a hydrogen plasma power of 100 W for one hour to form a semiconductor layer doped with B to a thickness of 1300 Å. Thereafter, following the same procedure as in Example 1, electrodes were formed to prepare TFT (the sheet resistivity on the surface of the doped semiconductor layer was 0.1 Ω per square).

According to the same procedure as described above except for varying the conditions for ion injection, various TFT's were prepared, and TFT characteristics are shown in relation to the hydrogen content and the layer thickness of the doped layer, including those of the above example, in Table 3 (Sample No. 301–305).

TABLE 3

| Sample No. | 301 | 302 | 303 | 304 | 305 |
|---|---|---|---|---|---|
| Layer thickness of doped layer (Å) | 100 | 350 | 720 | 1300 | 2900 |
| H content (atomic %) | 0.02 | 0.1 | 0.5 | 1.0 | 2.5 |
| Effective mobility of TFT (cm$^2$/V · sec) | 0.1 | 0.9 | 2.5 | 3.2 | 3.0 |
| Vth (V) | 12 | 7.4 | 6.1 | 6.0 | 6.0 |
| Change with lapse of time (%) | 0.5 | 0.2 | 0 | 0 | 2.5 |
| Overlapping width of gate electrode (Å) | 50 | 200 | 500 | 1000 | 2400 |

In the above Examples, Corning #7059 glass was employed as the substrate. Even when the heat treatment temperature and the substrate temperature may be elevated higher, similar characteristics could be obtained by employment of a ultra-hard glass or a quartz glass. Thus, according to the present invention, due to such a markedly high degree of freedom the choice of substrates that the substrate temperature, can be selected from a wide range, from the lower temperature side to the higher temperature side depending on the substrate material, TFT accumulated circuits having excellent characteristics can be prepared easily and at low cost by use of a more simple device.

As described above, in the present invention, thin film transistors exhibiting high performance characteristics of can be prepared with polycrystalline silicon thin films including hydrogen having shallowly doped semiconductor layers, and they can be used for simple image devices.

What is claimed is:

1. A thin film transistor comprising a substrate, a semiconductor layer comprising a polycrystalline silicon containing 3 atomic % or less of hydrogen provided on said substrate, a source region and a drain region provided in the surface part of said semiconductor layer, an insulating layer provided on said semiconductor layer between said source region and said drain region, a gate electrode provided on said insulating layer, a source electrode forming an electrical contact with said source region and a drain electrode forming an electrical contact with said drain region, wherein said insulating layer and said gate electrode have portions overlapping said source region and said drain region and the portion overlapping said source region and the portion overlapping said drain region are each 2000 Å or less in width.

2. A thin film transistor according to claim 1, wherein the substrate is made of a glass.

3. A thin film transistor according to claim 1, wherein the substrate is made of a heat-resistant plastic.

4. A thin film transistor according to claim 1, wherein the substrate is made of a heat-resistant ceramic.

5. A thin film transistor according to claim 1, wherein the overlapping portions are 1500 Å or less in width.

6. A thin film transistor according to claim 1, wherein the overlapping portiona are 1200 Å or less in width.

* * * * *

UNITED STATES PATENT AND TRADEMARK OFFICE
CERTIFICATE OF CORRECTION

PATENT NO. : 4,814,842
DATED : March 21, 1989
INVENTOR(S) : KATSUMI KAKAGAWA          Page 1 of 3

It is certified that error appears in the above-identified patent and that said Letters Patent is hereby corrected as shown below:

On the title page:

AT [57] ABSTRACT

Line 15, "begin" should read --being--.

COLUMN 1

Line 13, "film more particularly" should read --film. More particularly,--.
    Line 14, "transistor a" should read --transistor of a-- and "of" should be deleted.
    Line 17, "ity, said" should read --ity. Said--.
    Line 18, "the" should be deleted; "in its" should read --the--; and "wiring in its," should read --wiring,--.
    Line 31, "EL). A" should read --EL). ¶ A--.
    Line 45, "of" should be deleted.
    Line 48, "productin" should read --production--.
    Line 59, "by" should be deleted.

COLUMN 2

Lines 14-15, "crystallinity. ¶ However," should read --crystallinity. However,--.
    Line 56, "characteristics" should read --characteristics.--.
    Line 57, "and" should read --Also--.
    Line 60, "including" should read --by including--.

COLUMN 3

Line 23, "overlappiing" should read --overlapping--.
    Line 27, "200 A" should read --2000 A--.
    Line 36, "illustrating" should read --illustration--.

UNITED STATES PATENT AND TRADEMARK OFFICE
CERTIFICATE OF CORRECTION

PATENT NO. : 4,814,842
DATED : March 21, 1989
INVENTOR(S) : KATSUMI KAKAGAWA

It is certified that error appears in the above-identified patent and that said Letters Patent is hereby corrected as shown below:

COLUMN 4

Line 13, "Depositio) and" should read --Deposition)--.
    Line 64, "controlling" should read --control--.

COLUMN 5

Line 9, "further" should be deleted.

COLUMN 6

Line 26, "inclined" should read --included--.
    Line 42, "2000 Å also" should read --2000 Å. Also--.

COLUMN 7

Line 20, "500 hours" should read --500 hours of--.

COLUMN 8

Line 8, "(FE-TET)" should read --(FE-TFT)--.
    Line 10, "as" second occurrence should read --a--.
    Line 27, "described" should read --describes--.
    Line 59, "vol.%" should read --3 vol.%--.

COLUMN 10

Line 29, "porcedure" should read --procedure--.
    Line 46, "effective" should read --effected--.

UNITED STATES PATENT AND TRADEMARK OFFICE
CERTIFICATE OF CORRECTION

PATENT NO. : 4,814,842
DATED : March 21, 1989
INVENTOR(S) : KATSUMI KAKAGAWA

Page 3 of 3

It is certified that error appears in the above-identified patent and that said Letters Patent is hereby corrected as shown below:

COLUMN 12

Line 2, "temperature," should read --temperatures--.
Line 10, "of" should be deleted.
Line 40, "portiona" should read --portions--.

Signed and Sealed this

Thirty-first Day of July, 1990

Attest:

HARRY F. MANBECK, JR.

*Attesting Officer*   *Commissioner of Patents and Trademarks*